United States Patent
Park

(10) Patent No.: US 10,302,674 B2
(45) Date of Patent: May 28, 2019

(54) TEST DEVICE

(71) Applicant: LEENO INDUSTRIAL INC., Busan (KR)

(72) Inventor: Sang-Duck Park, Busan (KR)

(73) Assignee: LEENO INDUSTRIAL INC. (KR)

( * ) Notice: Subject to any disclaimer, the term of this patent is extended or adjusted under 35 U.S.C. 154(b) by 0 days.

(21) Appl. No.: 15/643,754

(22) Filed: Jul. 7, 2017

(65) Prior Publication Data
US 2017/0315150 A1 Nov. 2, 2017

Related U.S. Application Data

(63) Continuation of application No. PCT/KR2016/000803, filed on Jan. 26, 2016.

(30) Foreign Application Priority Data

Feb. 5, 2015 (KR) ........................ 10-2015-0017754

(51) Int. Cl.
*G01R 1/04* (2006.01)
(52) U.S. Cl.
CPC ......... *G01R 1/0433* (2013.01); *G01R 1/0408* (2013.01); *G01R 1/0416* (2013.01)
(58) Field of Classification Search
CPC .. G01R 3/00; G01R 31/2891; G01R 31/2886; G01R 31/2889; G01R 1/06722; G01R 1/06733

(Continued)

(56) References Cited

U.S. PATENT DOCUMENTS 4,750,890 A * 6/1988 Dube .................. H05K 7/1007
439/152
4,780,086 A * 10/1988 Jenner ................ G01R 1/07335
324/754.01

(Continued)

FOREIGN PATENT DOCUMENTS

| CN | 1877342 A | 12/2006 |
|---|---|---|
| CN | 101153885 A | 4/2008 |

(Continued)

OTHER PUBLICATIONS

International Search Report (PCT/KR2016/000803), WIPO, dated May 18, 2016.

(Continued)

*Primary Examiner* — Christopher P McAndrew
(74) *Attorney, Agent, or Firm* — Park & Associates IP Law, P.C.

(57) ABSTRACT

A test device for testing electric properties of an object. The test device includes an object support unit configured to support an object; a cover unit configured to include a cover body coupled to the object support unit and a pusher supported by the cover body so as to move toward and away from the object; and a pressure adjuster configured to include a multi-stage adjusting cam which is rotatably provided in the cover body while contacting the pusher and has a multi-stage contact pressing portion with contact radii varied depending on rotated angles so that the pusher can be in a moving-back position and be positioned at a plurality of pressing distances from the cover body, and an operation unit which operates the multi-stage adjusting cam.

7 Claims, 3 Drawing Sheets

(58) Field of Classification Search
USPC .................................................. 324/754.01
See application file for complete search history.

(56) References Cited

U.S. PATENT DOCUMENTS

| | | | | |
|---|---|---|---|---|
| 5,000,696 | A * | 3/1991 | Matsuoka | H05K 7/1023 439/330 |
| 5,395,254 | A * | 3/1995 | Mogi | H05K 7/1007 439/331 |
| 5,748,007 | A * | 5/1998 | Gaschke | G01R 1/0483 324/750.05 |
| 5,807,104 | A | 9/1998 | Ikeya et al. | |
| 6,086,387 | A * | 7/2000 | Gallagher | G01R 1/0483 439/331 |
| 6,152,744 | A | 11/2000 | Maeda | |
| 6,903,941 | B2 * | 6/2005 | Paola | H05K 7/1084 361/790 |
| 2006/0279317 | A1 | 12/2006 | Takahashi | |
| 2008/0094094 | A1 | 4/2008 | Ohkura | |
| 2011/0001506 | A1 | 1/2011 | Washio et al. | |
| 2011/0072622 | A1 * | 3/2011 | Stone | B66D 1/54 24/134 R |

FOREIGN PATENT DOCUMENTS

| | | |
|---|---|---|
| CN | 101900749 A | 12/2010 |
| CN | 101943741 A | 1/2011 |
| CN | 102236031 A | 11/2011 |
| CN | 203275549 U | 11/2013 |
| JP | 8-213128 A | 8/1996 |
| JP | 11-26124 A | 1/1999 |
| JP | 2003-217769 A | 7/2003 |
| JP | 2006-184199 A | 7/2006 |
| JP | 2006-252946 A | 9/2006 |
| JP | 4304699 B2 | 7/2009 |
| JP | 2010-15894 A | 1/2010 |
| JP | 2012-69460 A | 4/2012 |
| KR | 10-2011-0137558 | 12/2011 |
| KR | 10-2014-0134820 A | 11/2014 |
| TW | M333568 | 6/2008 |

OTHER PUBLICATIONS

Japanese Office Action (JP 2017-534820), JPO, dated May 29, 2018.

* cited by examiner

TEST DEVICE

REFERENCE TO RELATED APPLICATIONS

This is a continuation of pending International Patent Application PCT/KR2016/000803 filed on Jan. 26, 2016, which designates the United States and claims priority of Korean Patent Application No. 10-2015-0017754 filed on Feb. 5, 2015, the entire contents of which are incorporated herein by reference.

FIELD OF THE INVENTION

Apparatuses and methods consistent with the exemplary embodiments relate to a test device for testing an electronic component such as a semiconductor, and more particularly to a burn-in socket with a pusher for pressing an electronic component to inspect electric properties.

BACKGROUND OF THE INVENTION

In a process of manufacturing an electronic component such as an integrated circuit (IC), a test device is required to inspect a finally manufactured electronic component. Such a test device employs a burn-in socket for testing an electronic component under a condition of a high temperature.

The burn-in socket includes an insert having an accommodating portion to accommodate an electronic component to be tested, and a cover hinge-connecting with the insert to open/close the accommodating portion. The cover includes a pusher for selectively pressing a test component when the electronic component accommodated in the insert is tested, and a heat-dissipation member for providing a cooling effect when the electronic component is tested under the condition of high temperature.

Since the burn-in socket includes the pusher for pressing the electronic component and the heat-dissipation member for dissipating heat, there are problems of a very complicated pressing mechanism and high manufacturing costs.

SUMMARY OF THE INVENTION

One or more exemplary embodiments may provide a test device having a simple structure and manufactured with low costs.

Another exemplary embodiment may provide a test device capable of easily testing various kinds of electronic products without changing the test device.

Still another exemplary embodiment may provide a test device having an improved lifespan.

Yet another exemplary embodiment may provide a test device capable of testing objects corresponding to various thicknesses.

According to an aspect of a first exemplary embodiment, there is provided a test device for testing electric properties of an object, including an object support unit configured to support an object; a cover unit configured to include a cover body coupled to the object support unit and a pusher supported by the cover body so as to move toward and away from the object; and a pressure adjuster configured to include a multi-stage adjusting cam which is rotatably provided in the cover body while contacting the pusher and has a multi-stage contact pressing portion with contact radii varied depending on rotated angles so that the pusher can be in a moving-back position and be positioned at a plurality of pressing distances from the cover body, and an operation unit which operates the multi-stage adjusting cam.

The multi-stage adjusting cam may be coupled to the cover body by the hinge and the multi-stage contact pressing portion may including a plurality of flat surfaces formed on an outer surface in the radius direction of the hinge.

The cover unit may comprise a spring elastically supporting the pusher against the cover body.

The test device may further comprise a tray member between the pusher and the multi-stage adjusting cam.

The tray member may be detachable.

The test device according to the present invention is capable of easily testing various kinds of electronic products without changing the test device.

The test device can be designed in a simple structure and manufactured with low cost, by improving a operating mechanism of the pusher.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Below, exemplary embodiments will be described in detail with reference to accompanying drawings. The following embodiments describe only features directly related to the present inventive concept, and the descriptions about the other features will be omitted. Like numerals refer to like elements throughout.

Further, details obvious to a person having an ordinary skill in the art will not be described. In the following description, terms such as first, second and the like are used for just distinguishing between elements and do not concern their relationship or order.

Figure 1:
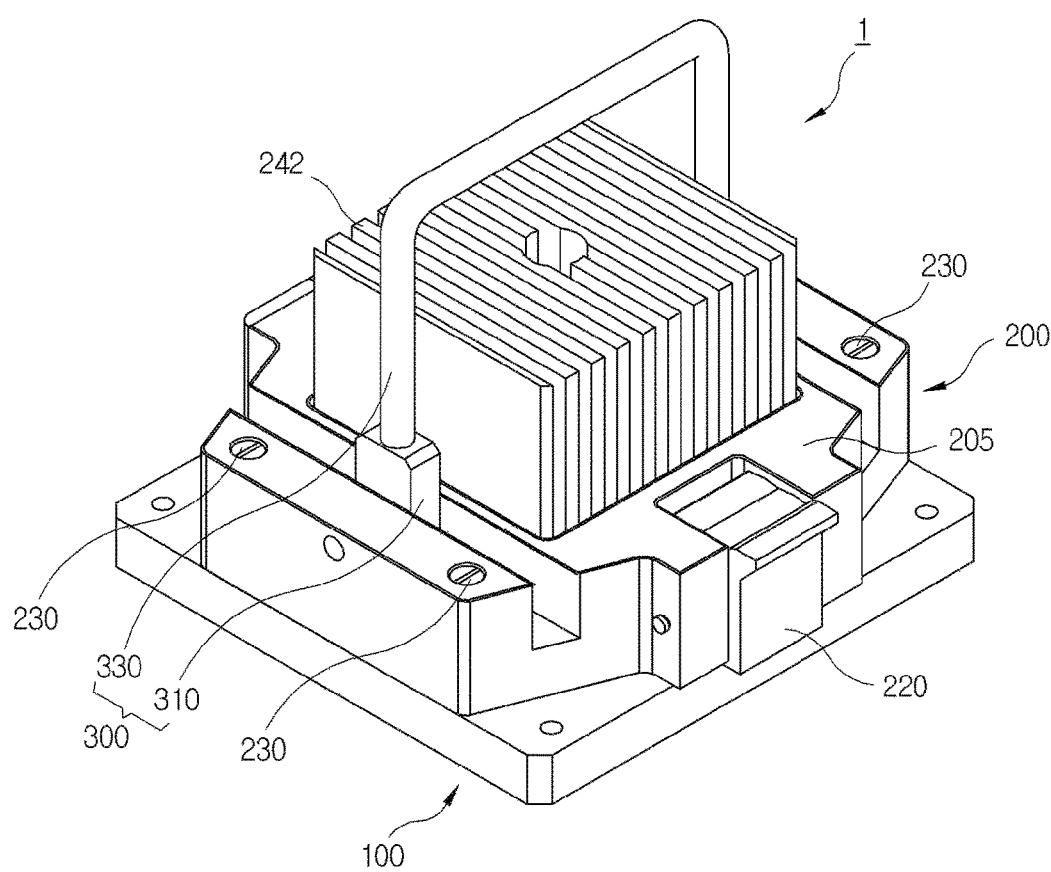
FIG. 1 is a perspective view of a test device according to an exemplary embodiment.
Figure 2:
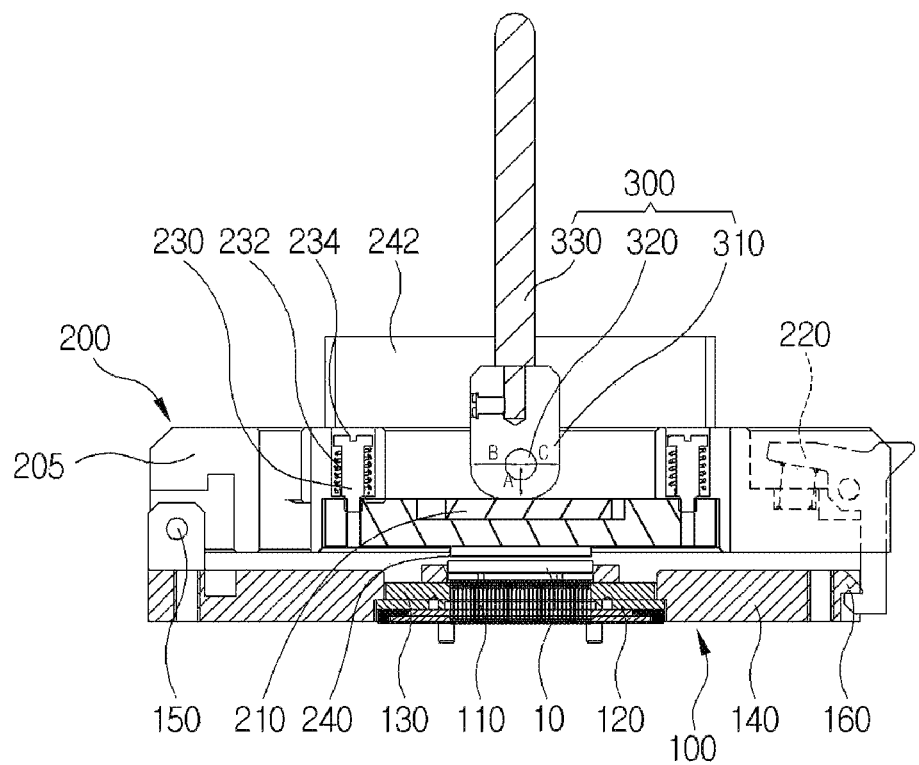
FIGS. 2 to 4 are cross-section views showing use states of the test device according to an exemplary embodiment.

As shown in FIGS. 1 and 2, a test device 1 according to an exemplary embodiment includes an object support unit 100, a cover unit 200 and a pressure adjuster 300. The object support unit 100 includes a probe supporter 120 supporting a plurality of elastically flexible probes 110, an insert 130 arranged on the probe supporter 120 and having an object accommodating portion to accommodate an electronic component 10 such as a semiconductor or the like (hereinafter, referred to as an "object"), and a support frame 140 supporting the probe supporter 120. This object support unit 100 is described just as an example and not limited to the foregoing structure.

Below, details of the test device 1 according to the exemplary embodiment will be described with reference to FIGS. 1 and 2.

The object 10 has a plurality of contact points to be tested such as bumps, and a laminated-structure semiconductor such as a package on package (POP) semiconductor may be applied thereto. The object 10 is accommodated in the object accommodating portion of the insert 130 so that the contact points to be tested can correspond to probes 110 supported by the probe supporter 120. Then, the object 10 arranged like this is pushed by a pusher 240 (to be described later) to move toward and come into contact with and the corresponding probes 110, thereby undergoing the test. The POP semiconductor has a laminated-semiconductor structure, and thus undergoes a primary test before lamination and a secondary test after the lamination. Since the semiconductor before the lamination and the semiconductor after the lamination are different in thickness from each other, the pusher 240 has to take the thickness difference into account. According to an exemplary embodiment, one test device is used to test the semiconductor before the lamination and the semiconductor after the lamination, which is different in thickness from each other.

The cover unit 200 includes a cover body 205 coupled to the object support unit 100 and a pusher 240 supported by the cover body 205 so as to move toward and away from the object. The cover body 205 may be rotatably coupled to one side of the support frame 140 of the object support unit 100 by a hinge pin 150. The cover body 205 is shaped like a frame having a communication opening in the middle thereof, and has a latch 220 mounted therein which is rotatably coupled to a side opposite to the hinge coupling side. The latch 220 may be secured to a hook 160 of the support frame 140 in the state that the cover body 205 is rotated to fully cover the object accommodating portion.

The pusher 240 is installed at the center of the cover body 205 and movable up and down elastically by a spring 232 put on a screw 230 supporting the pusher 240. The screw 230 may include a screw head 234, a screw body 236 and a threaded end portion 238. The cover body 205 includes through holes each having two different diameters in a thickness direction; a first inner diameter is large enough to receive the screw head 234 and a second inner diameter is large enough to pass not the screw head 234 but the screw body 236, and the first inner diameter is larger than the second inner diameter. The screw 230 is inserted in the through hole having the first inner diameter and then the threaded end portion 238 passes through the through hole having the second inner diameter and screw-couples with the pusher 240 in the state that the spring 232 is put on the screw body 236, thereby supporting the pusher 240 elastically movable up and down.

The pusher 240 and a heat-dissipation member 242 may be separately provided and then coupled to each other, or may be formed as a single body.

The pressure adjuster 300 for moving the pusher 240 up and down may include a multi-stage adjusting cam 310 rotatably coupled to the cover body 205 by a hinge shaft 320, and an operation unit (operation handle) 330 rotating the multi-stage adjusting cam 310.

The multi-stage adjusting cam 310 includes a hinge hole (not shown) to which the hinge shaft 320 is fitted for the hinge-coupling with the cover body 205. The multi-stage adjusting cam 310 includes multi-stage contact pressing portions varied in diameter depending on rotated angles. The multi-stage contact pressing portions may comprise a plurality of flat surfaces formed on the outer surface in the radius direction of hinge shaft 320. Due to the multi-stage contact pressing portions, there are various distances A, B and C from the center of the hinge hole to multi-stage contact pressing portions as the multi-stage adjusting cam 310 rotates. In result, the multi-stage adjusting cam 310 may push the pusher 240 by multi-stages contact pressing portions or returns the pusher 240 by the spring 232, based on the difference among the distances A, B and C from the center of the hinge hole to the contact pressing portion. In this embodiment, the multi-stage adjusting cam 310 has three different distances A, B and C from the center of the hinge hole to the multi-stages contact pressing portions when it is rotated at an angle of 90 degrees, but not limited thereto. Alternatively, the multi-stage adjusting cam may have more various distances from the center of the hinge hole to the multi-stages contact pressing portions when it is rotated at an angle of 45 degrees or at smaller angles.

The pusher 240 may further include a tray member 210 interposed between the contact pressing portion of the multi-stage adjusting cam 310 and the pusher 240. In result, the multi-stage adjusting cam 310 may rotate in the state that the contact pressing portion is in contact with the tray member 210. In this embodiment, it is possible to test various kinds of objects by adjusting the thickness of the tray member 210. The tray member 210 is detachable, and it is therefore possible to directly apply the test device even through a product is changed in thickness.

Since the multi-stage adjusting cam 310 is repetitively rotated while being in contact with the tray member 210 during the test, the multi-stage adjusting cam 310 may wear down and thus the pressing distance of the pusher 240 may be varied. To solve this problem, at least one of the multi-stage adjusting cam 310 and the tray member 210 according to an exemplary embodiment may be made of engineering plastic or the like anti-wear plastic.

The multi-stage adjusting cam 310 is fitted to a pair of slots formed at the opposite sides of the cover body 205, and then the hinge shaft 320 is inserted into the hinge hole of the multi-stage adjusting cam 310 by penetrating the outside of the slot. Thus, the multi-stage adjusting cam 310 is installed.

The operation unit (operation handle) 330 is coupled to the multi-stage adjusting cam 310 while avoiding the contact pressing portions. The operation unit (operation handle) 330 may connect a pair of multi-stage adjusting cams 310, which are arranged in the cover body 205 and opposite to each other. In result, the pair of multi-stage adjusting cams 310 is simultaneously rotated by rotating the operation unit (operation handle) 330.

The heat-dissipation member 242 is arranged in the middle opening of the cover body 205 and protrudes from the cover body 205 to some extent since it requires a considerable volume. The pair of multi-stage adjusting cams 310 are arranged to face each other with the protruding heat-dissipation member 242 therebetween, and thus the operation unit (operation handle) 330 is extended to surround the protruding heat-dissipation member 242 leaving a predetermined distance.

Below, operations of the test device 1 according to an exemplary embodiment will be described with reference to FIGS. 2 to 4.

First, an object 10 is inserted in the insert 130 in the state that the cover unit 200 is fully opened from the object accommodating portion of the insert 130. Then, the cover unit 200 is rotated to completely cover the object accommodating portion, and the latch 220 is latched to the hook 160 as shown in FIG. 2.

Referring to FIG. 2, the pusher 240 is in an initial state where the pusher 240 does not contact the object 10 accommodated in the object accommodating portion. At this time, the contact distance from the center of the hinge hole of the multi-stage adjusting cam 310 to the tray member 210 of the pusher 240 is a relative short distance of "A".

Figure 3:
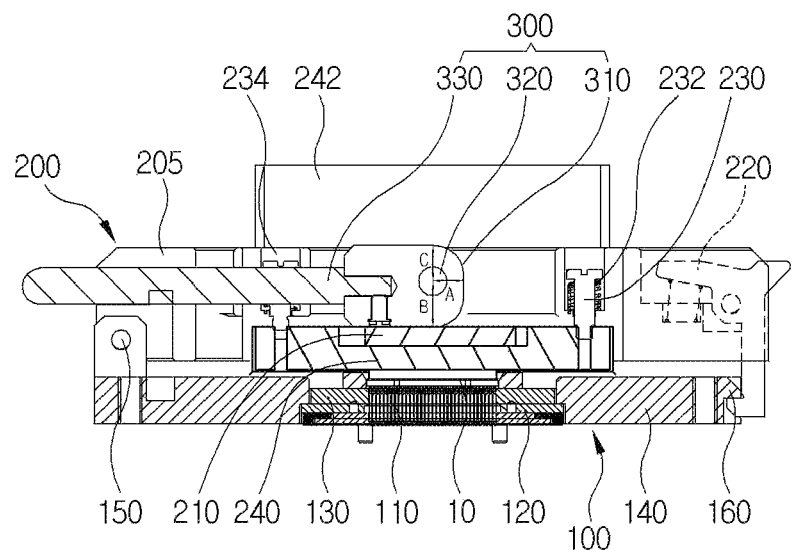

If the operation unit (operation handle) 330 is rotated by an angle of about 90 degrees in an opposite direction to the hook 160 as shown in FIG. 3, the multi-stage adjusting cam 310 is rotated so that the contact pressing portion of the multi-stage adjusting cam 310 presses the pusher 240 to move down. At this time, the contact distance from the center of the hinge hole of the multi-stage adjusting cam 310 to the tray member 210 of the pusher 240 is a relative long distance of "B". As a result, the pusher 240 moves down as much as "B-A" distance to press the object 10, and thus the object 10 moves toward and contacts the probes 110, thereby performing the test. In the state shown in FIG. 3, it is possible to test a product before the lamination for the POP semiconductor, i.e. a thin object by way of example.

Figure 4:
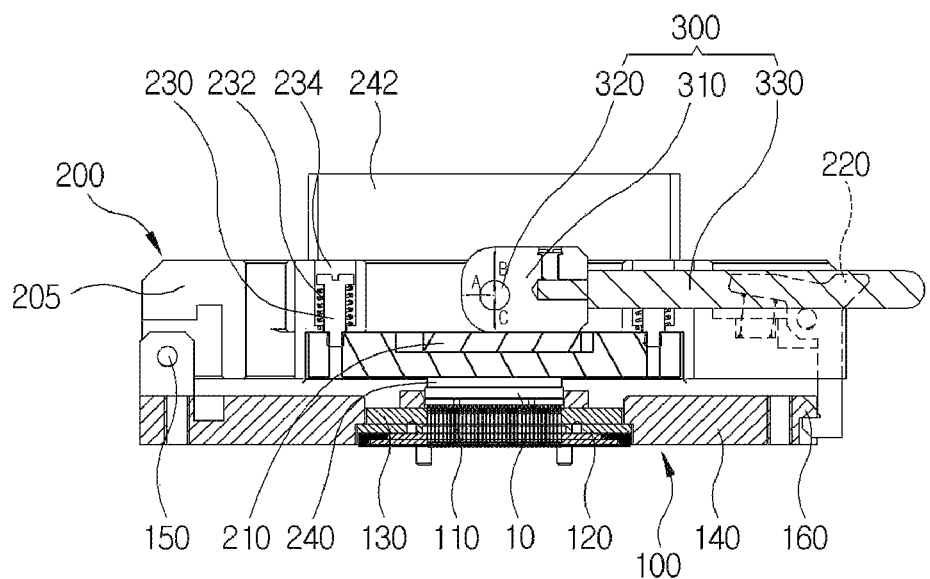

If the operation unit (operation handle) 330 is rotated from the standing state toward the hook 160 by an angle of about 90 degrees as shown in FIG. 4, the multi-stage adjusting cam 310 is rotated so that the contact pressing portion of the multi-stage adjusting cam 310 presses the pusher 240 to move down. At this time, the contact distance from the center of the hinge hole of the multi-stage adjusting cam 310 to the tray member 210 of the pusher 240 is a distance of "C". As a result, the pusher 240 moves down as much as "C-A" distance to press the object 10, and thus the object 10 moves toward and contacts the probes 110, thereby performing the test. In the state shown in FIG. 4, it is for example possible to test a product after the lamination such as the POP semiconductor, i.e. a thick object.

According to an exemplary embodiment, the test device has an improved operation mechanism of a pusher in a burn-in socket, and is thus designed with a simple and inexpensive structure.

Further, the test device according to an exemplary embodiment is capable of testing an object having various thicknesses without changing components of the test device.

Although a few exemplary embodiments have been shown and described, it will be appreciated by those skilled in the art that changes may be made in these exemplary embodiments without departing from the principles and spirit of the invention. Therefore, the foregoing has to be considered as illustrative only. The scope of the invention is defined in the appended claims and their equivalents. Accordingly, all suitable modification and equivalents may fall within the scope of the invention.

What is claimed is:

1. A test device for testing electric properties of an object, the test device comprising:
    an object support unit configured to support an object;
    a cover unit comprising a cover body coupled to the object support unit and a pusher supported by the cover body so as to move toward and away from the object upon operation; and
    a pressure adjuster comprising a multi-stage adjusting cam which is rotatably coupled to the cover body and configured to move the pusher upon rotation, and the multi-stage adjusting cam has a cam surface with contact radii varied depending on rotated angles so that the pusher can be positioned at a plurality of pressing positions with respect to the cover body for pressing the object, and an operation unit which operates the multi-stage adjusting cam,
    wherein the cam surface of the multi-stage adjusting cam includes a plurality of arcuate surface regions, and a plurality of flat surface regions between the arcuate surface regions, and the flat surface regions are configured as designated stop positions to move the pusher to a preset distance,
    wherein the designated stop positions include a first stop position not for pressing the object, and a second stop position and a third stop position for pressing the object, the third stop position configured to press the object to a distance less than that of the second stop position.

2. The test device according to claim 1, wherein the multi-stage adjusting cam is coupled to the cover body by a hinge, and has three stop positions of the first stop position, the second stop position, and the third stop position, which are spaced apart by ninety (90) degrees to each other.

3. The test device according to claim 1, wherein the cover unit comprises a spring elastically supporting the pusher against the cover body.

4. The test device according to claim 1, further comprising a tray member between the pusher and the multi-stage adjusting cam.

5. The test device according to claim 4, wherein the tray member is detachable.

6. The test device according to claim 1, wherein the pressure adjuster includes two multi-stage adjusting cams rotatably coupled to both sides of the cover body, and the operation unit includes a handle connected between the two multi-stage adjusting cams.

7. The test device according to claim 1, further comprising a heat dissipation member received in a through opening of the cover body and configured to contact an upper surface of the object to dissipate heat therefrom during a test.

* * * * *